(12) United States Patent
Kohola

(10) Patent No.: US 7,155,175 B2
(45) Date of Patent: Dec. 26, 2006

(54) REDUCTION OF PARASITIC IMPEDANCES IN A PHASE-LOCKED LOOP

(75) Inventor: Jukka Kohola, Oulu (FI)

(73) Assignee: Nokia Corporation, Espoo (FI)

( * ) Notice: Subject to any disclaimer, the term of this patent is extended or adjusted under 35 U.S.C. 154(b) by 364 days.

(21) Appl. No.: 10/738,583

(22) Filed: Dec. 17, 2003

(65) Prior Publication Data

US 2004/0152425 A1 Aug. 5, 2004

(30) Foreign Application Priority Data

Dec. 20, 2002 (EP) .................................. 02102856

(51) Int. Cl.
*H04B 1/38* (2006.01)
*H03L 7/06* (2006.01)

(52) U.S. Cl. .................... 455/73; 455/86; 455/76; 327/157

(58) Field of Classification Search .......... 455/73, 455/86, 76, 180.3, 264, 260, 315, 316, 317, 455/318; 331/17; 327/156, 157, 147
See application file for complete search history.

(56) References Cited

U.S. PATENT DOCUMENTS

| | | | | |
|---|---|---|---|---|
| 5,598,405 A | * | 1/1997 | Hirose | 327/156 |
| 5,818,287 A | * | 10/1998 | Chow | 327/157 |
| 5,825,640 A | * | 10/1998 | Quigley et al. | 327/157 |
| 6,420,914 B1 | * | 7/2002 | Hasegawa | 327/157 |
| 6,642,759 B1 | * | 11/2003 | Hughes | 327/157 |
| 6,832,173 B1 | * | 12/2004 | Starr et al. | 327/157 |
| 6,856,182 B1 | * | 2/2005 | Moyal | 327/157 |
| 6,885,700 B1 | * | 4/2005 | Kim et al. | 455/180.3 |
| 6,960,949 B1 | * | 11/2005 | Suzuki | 327/157 |
| 6,963,232 B1 | * | 11/2005 | Frans et al. | 327/156 |
| 6,975,840 B1 | * | 12/2005 | Lin | 455/76 |
| 2003/0224736 A1 | * | 12/2003 | Lin | 455/76 |

FOREIGN PATENT DOCUMENTS

| | | |
|---|---|---|
| DE | 100 32 248 A1 | 1/2002 |
| EP | 1 037 366 A2 | 9/2000 |

* cited by examiner

*Primary Examiner*—Aung Moe
(74) *Attorney, Agent, or Firm*—Hollingsworth & Funk, LLC

(57) ABSTRACT

A radio transceiver of a telecommunication system is provided, the radio transceiver including an integrated circuit comprising a phase locked loop, the phase locked loop including a voltage controlled oscillator, a detector unit, and a control unit. The spurious charge accumulated in the charge source in the control unit is conducted to the ground between two successive current pulses generated by the charge source, thus improving the stability and spectral quality of the output signal of the phase locked loop.

50 Claims, 2 Drawing Sheets

REDUCTION OF PARASITIC IMPEDANCES IN A PHASE-LOCKED LOOP

FIELD

Figure 1:
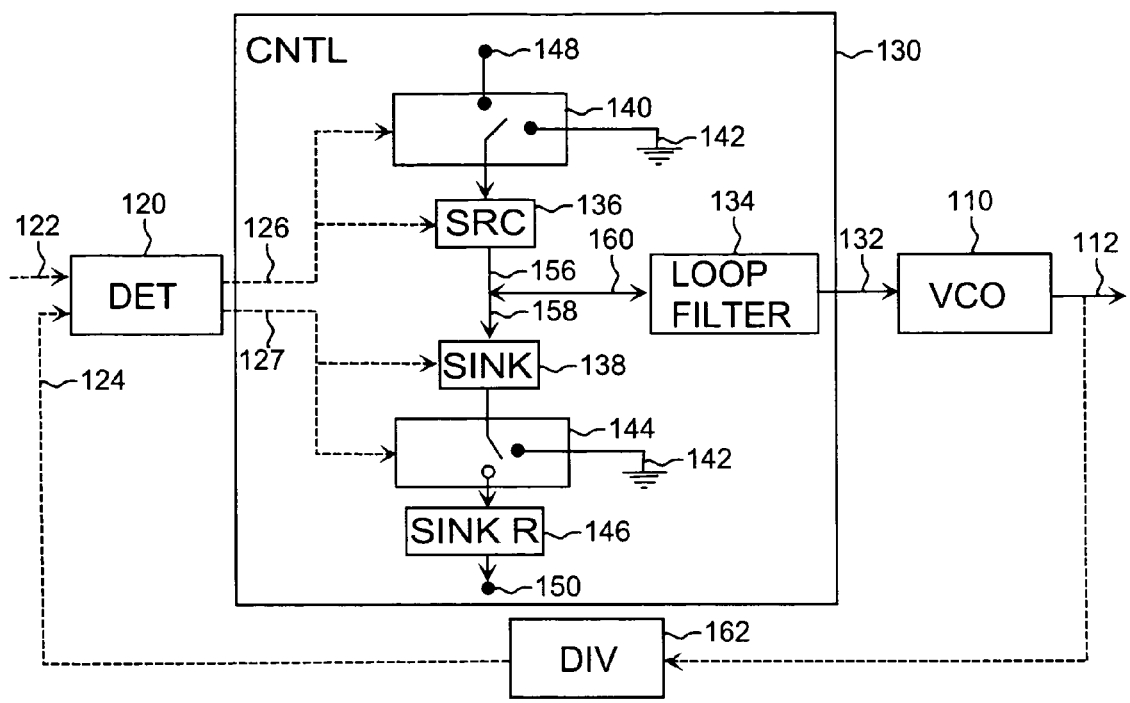

The invention relates to a radio transceiver, particularly to a radio transceiver including an integrated circuit with a phase locked loop.

BACKGROUND

A phase locked loop (PLL) implemented with an integrated circuit (IC) provides an efficient tool in implementing high-frequency components for radio transceivers in telecommunication systems. A phase locked loop is known as a feedback system for providing electric signals that are accurate in frequency and stable in phase. A typical phase locked loop includes a voltage controlled oscillator (VCO), a control unit, and a detector unit. The voltage controlled oscillator generates an output signal of the phase locked loop with frequency proportional to control voltage generated by a control unit. The control unit is connected to a detector unit that forms waveforms which are fed into the control unit, the waveforms being based on a reference signal and a feedback signal proportional to the output signal of the voltage controlled oscillator.

The control unit includes a loop filter for forming the control voltage for the voltage controlled oscillator, a charge source for providing charge for the loop filter based on the waveforms generated by the detector unit, and a charge sink for removing charge from the loop filter based on the waveforms generated by the detector unit.

The control voltage in the loop filter is induced by current pulses between the charge source and the charge sink, the duration of the current pulses regulating the control voltage level, and consequently the output frequency of the phase locked loop. In an optimal case, when the phase lock loop is locked, the current injected by the charge source is absorbed by the charge sink, resulting in zero net current to the loop filter, a stable operation of the phase locked loop and desired spectral characteristics of the output signal.

However, an accumulation of spurious charge in the charge source occurs due to parasitic capacitance of the charge source. The parasitic charge generates a leakage current to the loop filter between the phase comparison cycles resulting an in unstable operation of the phase locked loop, and increasing spectral impurities, such as spurious frequencies and deformation of the line shape, of the output signal. The spectral impurities cause imperfect performance of radio transceivers and therefore reduce the overall capacity of a telecommunication system.

BRIEF DESCRIPTION OF THE INVENTION

It is an object of the invention to provide a radio transceiver of a telecommunication system, the radio transceiver including an integrated circuit with a phase locked loop with enhanced stability and spectral characteristics. This is achieved by a radio transceiver of a telecommunication system, the radio transceiver including an integrated circuit comprising a phase locked loop, the phase locked loop comprising: a voltage controlled oscillator for generating an output signal with a frequency proportional to a control voltage fed, into the voltage controlled oscillator; a detector unit operationally connected to the voltage controlled oscillator for forming waveforms, based on a reference signal and a feedback signal, the feedback signal being proportional to the output signal of the voltage controlled oscillator; a loop filter for forming the control voltage for the voltage controlled oscillator; a charge source for providing charge for the loop filter during an active state of the charge source, based on a waveform generated by the detector unit; and a charge sink for removing charge from the loop filter during an active state of the charge sink, based on a waveform generated by the detector unit. According to the invention, the phase locked loop further comprises a source switch for conducting at least a portion of parasitic charge of the charge source to the ground between two successive active states of the charge source.

Preferred embodiments of the invention are described in the dependent claims.

The radio transceiver with a phase locked loop according to the invention is based on placing a switch in the charge source branch of the control unit so that the parasitic charge accumulated in the charge source can be conducted to the ground while the charge source is in a non-conductive state.

The radio transceiver of the invention provides several advantages. In an aspect, the invention enables implementation of a radio transceiver with a phase locked loop planted on an integrated circuit so that stability and the spectral quality of the output signal of the phase lock loop are improved. In another aspect, the invention provides a radio transceiver in a telecommunication system whose properties enable meeting requirements set by the specifications of a telecommunication system.

LIST OF THE DRAWINGS

Figure 2:
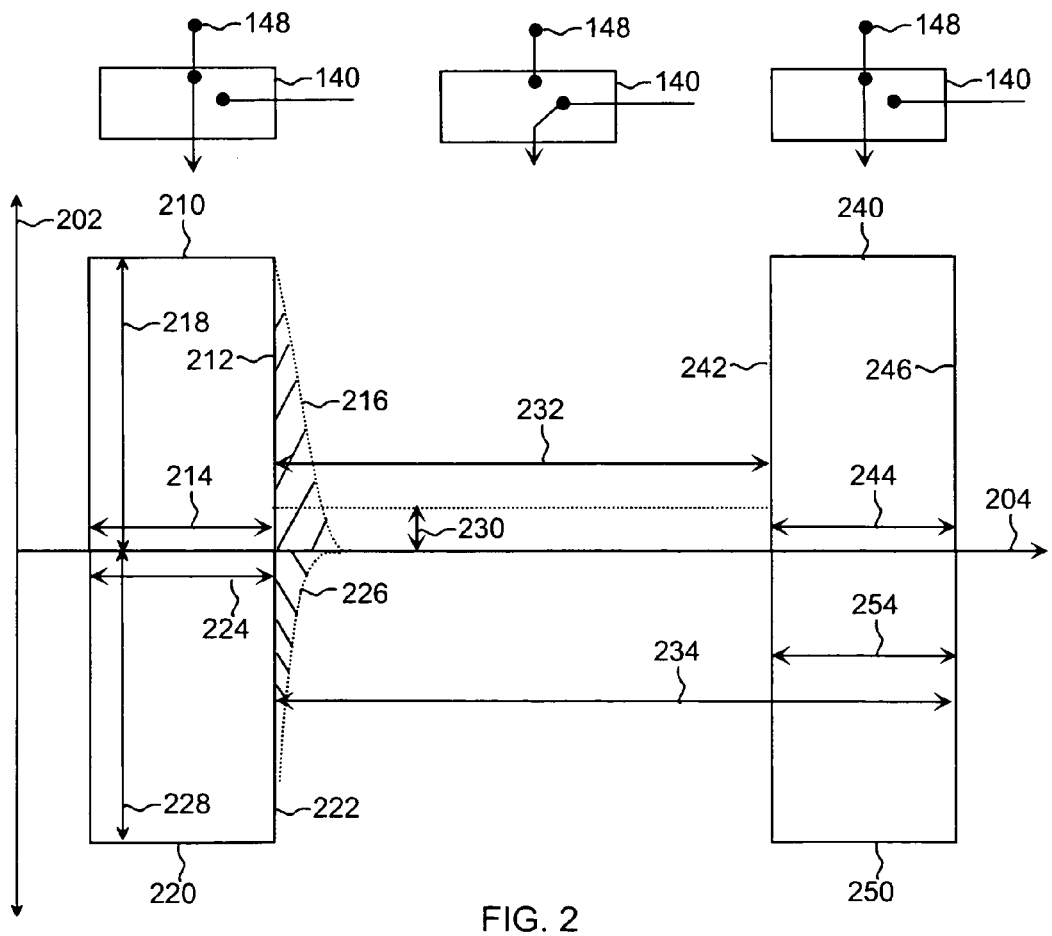
Figure 3:
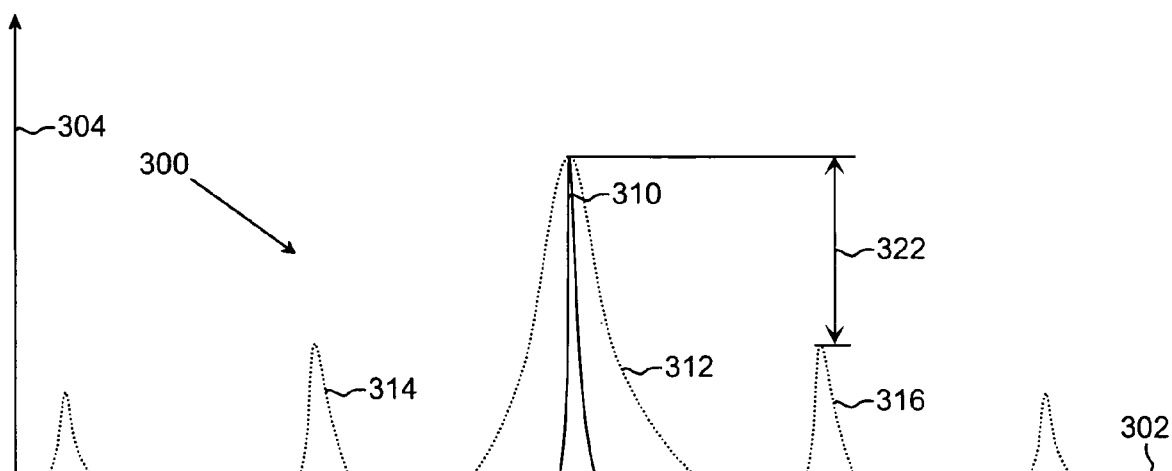

In the following, the invention will be described in greater detail with reference to the preferred embodiments and the accompanying drawings, in which FIG. 1 is a block diagram illustrating an example of a structure of a phase locked loop;

FIG. 2 shows an example of a signal chart of signals occurring in a phase locked loop, and FIG. 3 shows an example of a frequency spectrum of a phase locked loop.

DESCRIPTION OF EMBODIMENTS

The radio transceiver according to the invention can be located in a base station or/and in user equipment of the telecommunication system. In an embodiment of the invention, the telecommunication system is a GSM system (Global System for Mobile Communications) where the radio transceiver according to the invention implements the radio interface between user equipment and a base transceiver station. The structure and operational details of a GSM system are known to a person skilled in the art.

With reference to FIG. 1, examine an example of a structure of a phase locked loop according to the invention illustrated by a block diagram. The main parts of the phase locked loop are a voltage controlled oscillator 110, a detector unit 120, and a control unit 130.

The voltage controlled oscillator 110 generates a time dependent output signal 112 with a characteristic frequency spectrum. The frequency characteristics of the output signal 112 are proportional to a control voltage 132 fed into the voltage controlled oscillator 110. The structure and implementation of a voltage controlled oscillator 110 implemented with an integrated circuit are well known to a person skilled in the art, and will therefore not be described in further detail.

An output of the control unit 130 is connected to an input of the voltage controlled oscillator 110 so that the voltage generated by the control unit 130 provides the control voltage 132 that controls the voltage controlled oscillator 110. The control voltage can vary from zero to several volts, for example.

The control unit 130 is connected to the detector unit 120 so that waveforms 126 and 127 formed by the detector unit 120 provide control signals for the control unit 130.

The detector unit 120 uses a reference signal 122 and a feedback signal 124 as input, detects a difference in phase between the feedback signal 124 and the reference signal 122, and applies the waveforms 126 and 127 to the control unit 130 according to the detected difference. The reference signal 122 originates, for example, from a local oscillator not shown in FIG. 1. The feedback signal 124 is proportional to the output signal 112 of the voltage controlled oscillator 110. The phase locked loop comprises also a programmable divider 162 between the voltage controlled oscillator 110 and the detector unit 120 for generating a feedback signal 124 by using the output signal 112 of the voltage controlled oscillator 110 as input. The programmable divider 162 enables generating a high-frequency output signal 112 with frequency multiple of the frequency of the reference signal 122. The ratio between the frequency of the output signal 112 and that of the reference signal 122 can be controlled, thus providing tools for synthesizing transmit and reception frequencies in the radio transceiver according to the invention. The control unit 130 comprises a positive electrode 148 of a power supply, a negative electrode 150 of a power supply, a charge source 136, a charge sink 138, and a loop filter 134. The structure of the power supply is not shown. The charge source 136 and the charge sink 138 are implemented, for example, with transistors, such as bipolar junction transistors, implemented with an integrated circuit. The entity formed by the charge source 136 and the charge sink 138 can also be called a charge pump.

The waveforms 126 and 127 control the charge source 136 and the charge sink 138, respectively, so that current pulses occur between the charge source 136 and the charge sink 138. Loop filter current 160 is formed by the source current 156 and a sink current 158. During a source current pulse, charges are injected into a loop filter capacitor, thus increasing the control voltage 132. During a sink current pulse, charges are removed from the loop filter capacitor, thus increasing the control voltage 132. The waveforms 126 and 127 are also called charge-up pulse and charge-down pulse, respectively, referring to the charge accumulation process in the loop filter 134.

The loop filter 134 comprises a capacitive component, such as a capacitor for buffering charge originating from the current pulses and providing a direct-current control voltage 132.

With reference to FIG. 2, examine an example of a signal chart representing the current signals occurring in a phase locked loop when the phase locked loop is locked. The locked phase locked loop represents a stable operation of the phase locked loop, in which the phase and the frequency match between the feedback signal 124 and the reference signal 122. The coordinate axis 202 and 204 represent current amplitude and time in arbitrary scales, respectively. The positions of the source switch 140 during a phase comparison cycle are also shown above the signal chart.

The source current 156 is represented by a source pulse 210, which is applied during an active state 214 of the charge source 136. The duration of the active state 214 is used in regulating the level of the control voltage 132. The current amplitude 218 of the source pulse is typically of the order of 1 mA. The sink current 158 is represented by a sink pulse 220, which takes place during an active state 224 of the charge sink 138. The current amplitude 228 during the sink pulse 220 is also shown. When the phase locked loop is locked, the active state 224 of the charge sink 138 equals the active state 214 of the charge source 138. This means that the timing of the sink pulse 220 and that of the source pulse 210 are identical in an ideal case. The timing and duration of the up-pulse 210 and those of the down-pulse 220 are controlled by the waveforms 126 and 127, respectively, generated by the detector unit 120. The duration of the active state 214 can vary, for example, from nanoseconds to tens of nanoseconds.

Active states 244, 254 successive to the active states 214, 224 are also shown. During the second active state 244 of the charge source 136, a second source current pulse 240 and a second sink pulse 250 are generated. The time period between a leading edge 212 of the active state 214 and a leading edge 246 of the second active state 244 is called a phase comparison cycle 234. The duration of the phase comparison cycle 234 can vary from microseconds to milliseconds.

In an optimal case, when the phase locked loop is locked, no loop filter current 160 occurs. However, in a real system, a leakage current 216 is generated by the charge source 136 due to parasitic charge accumulated in the charge source 136 during the active state 214. The parasitic charge is caused by parasitic capacitance of the charge source 136. In this concept, the parasitic capacitance represents factors that cause undesired accumulation of charge in the charge source 136. When the active state 214 is completed, the spurious charge leaks through the charge source 136 to the loop filter 134 giving rise to the leakage current 216. The time average 230 of the leakage current 216 is also shown.

The leakage current 216 affects the control voltage 132 generated by the loop filter 134 by increasing the phase noise of the output signal 112 of the voltage controlled oscillator 110.

With reference to FIG. 3, examine an example of a frequency spectrum 300 of a phase locked loop. The coordinate axes 302 and 304 represent frequency and power in arbitrary scale, respectively. The frequency component 310 represents an ideal case, where the mean peak is free of effects due to the spurious charge of the charge source 136. For ease of discussion, no other frequency components are present in the ideal case.

When spurious charges in the charge source 136 occur, the mean peak 310 is deformed, giving rise to a deformed peak 312. The deformation, such as spreading of the power distribution at the mean peak frequency, is due to the phase noise. The phase noise, respectively, arises from the instability of the phase locked loop. From the point of view of a radio transmitter transmitting at such a frequency, the transmitting power is lowered at the peak centre, thus reducing the signal-to-noise ratio in reception and impairing the capacity of the telecommunication system.

The spurious charge accumulated in the charge source 136 also gives rise to spurious spectral components 314, 316 in the frequency spectrum. The power level of the spurious spectral components 314, 316 is usually limited by the specification of the telecommunication system standard. For example, in the GSM specification, the adjacent channel power level of the spurious spectral components 314, 316 has to be more than 60 dB lower than that of the main peak 310. The difference between the main peak power level and the power level of a spurious peak is indicated with indicator 322.

According to the invention, the control unit 130 comprises a source switch 140 for conducting at least a portion of the parasitic charge of the charge source 136 to the ground 142 between two successive active states 214, 244 of the charge source 136. The time period 232 when the source switch 140 can be conductive to the ground 142 is also shown. The source switch 140 can be implemented with a transistor implemented with the integrated circuit. In an embodiment of the invention, the source switch 140 is a bi-stable switch, which connects the charge source 136 to the ground 142 or to the positive electrode 148 of the power supply.

The source switch 140 is non-conductive when the source switch 140 is switched off. By applying the source switch 140 according to the invention, the power level of the spurious spectral components 314, 316 as well as the deformation of the main peak 310 can be reduced.

In an embodiment of the invention, the source switch 140 is located between the charge source 136 and the positive electrode 148 of the power supply. This location of the source switch 140 reduces the effects of the source switch 140 on the performance of the loop filter 134.

In an embodiment of the invention, the source switch 140 is switched conductive to the ground 142 at a trailing edge 212 of the active state 214 of the charge source 136. This embodiment enables an effective performance of the source switch 140 since the source switch 140 is switched on during the highest leakage current 216. The source switch 140 can be switched off at any time point between the two active states 214, 244 of the charge source 136. In an embodiment of the invention, the source switch 140 is switched on until a leading edge 242 of the second active state 244.

In an embodiment of the invention, the source switch 140 is controlled by the waveform 126 controlling the source switch 136. The control is illustrated in FIG. 1, where the control signals controlling the charge source 136 are used in controlling the source switch 140. In an embodiment of the invention, the waveform 126 controlling the charge source 136 is inverted at the source switch 140 so that when the charge source 136 is non-active, the source switch 140 is conductive. This embodiment reduces the number of control circuits controlling the source switch 140.

In an embodiment of the invention, the phase locked loop further comprises a sink switch 144 for conducting at least a portion of parasitic charge of the charge sink 138 to the ground 142 between two successive active states 224, 254 of the charge sink 138. It is noted that the potential of the ground 142 is preferably lower than that of the negative electrode 150 of the power supply when considered from the viewpoint of the operation of the sink switch 144 in order to effectively conduct the parasitic charge of the charge sink 138 to the ground 142.

In an embodiment of the invention, the phase locked loop comprises a sink resistor 146 between the sink switch 144 and the negative electrode 150 of the power supply. The sink resistor 146 shifts the relative potential of the negative electrode of the power supply and that of the ground 142 so that the current from the charge sink 138 to the ground 142 is sufficient while the sink switch 144 is conductive to the ground 142. The sufficiency of the current is dictated, for example, by the charge accumulation in the charge sink 138 and the requirements of the frequency spectrum of the phase locked loop.

The effect of the charge accumulation in the charge sink is illustrated in FIG. 2. During an active state 214 of the charge source 136, spurious charge is accumulated in the charge sink 138 due to parasitic capacitance components, thus generating a leakage current 226 after the active state 224 of the charge sink 138. As a result, the loop filter current 160 is influenced by effects similar to those caused by the leakage current 226 of the charge source 136.

In an embodiment of the invention, the sink switch 144 is located between the charge sink 138 and the negative electrode 150 of the power supply.

In an embodiment of the invention, the sink switch 144 is switched conductive to the ground 142 at a trailing edge 222 of the active state 224 of the charge sink 138. This embodiment enables an effective performance of the sink switch 144 since the sink switch 144 is switched on during the highest leakage current 226 of the charge sink 138. The sink switch 144 can be switched off at any time point between the two active states 224, 254.

In an embodiment of the invention, the sink switch 144 is switched on and off simultaneously with the source switch 140. That is, the sink switch 144 is switched conductive to the ground 142 at the same time as the source switch 140 is switched conductive to the ground 142, and the sink switch 144 is switched non-conductive to the ground 142 at the same time as the source switch 140 is switched non-conductive to the ground 142. The simultaneous switching enables use of shared control circuits controlling the two switches 140, 144. In an embodiment of the invention, the sink switch 144 is a bi-stable switch, which connects the charge sink 138 to the ground 142 or to the negative electrode 150 of the power supply.

In an embodiment of the invention, the sink switch 144 is controlled by the waveform 127 controlling the charge sink 138. This simplifies the structure of the integrated circuit since the number of the control circuits can be reduced. In an embodiment of the invention, the waveform 127 controlling the charge sink 138 is inverted at the sink switch 144 so that when the charge sink 138 is non-active, the sink switch 144 is conductive.

The entity formed by the voltage controlled oscillator 110, the detector unit 120 and the control unit can be implemented with an integrated circuit using the methods known to a person skilled in the art. The transistors used in the implementation can be, for example, bipolar junction transistors, which are economical in terms of consumption of the area of a silicon substrate on which the integrated circuit is planted.

Even though the invention is described above with reference to an example according to the accompanying drawings, it is clear that the invention is not restricted thereto but it can be modified in several ways within the scope of the appended claims. For example, only an example for implementation of the control unit 130 by the bipolar junction transistors has been presented, whereas it could also be implemented with MOS (Metal Oxide Semiconductor) technology.

The invention claimed is:

1. A radio transceiver of a telecommunication system, the radio transceiver including an integrated circuit comprising a phase locked loop, the phase locked loop comprising:
   a voltage controlled oscillator for generating an output signal with a frequency proportional to a control voltage fed into the voltage controlled oscillator;
   a detector unit operationally connected to the voltage controlled oscillator for forming waveforms, based on a reference signal and a feedback signal, the feedback signal being proportional to the output signal of the voltage controlled oscillator;

a loop filter for forming the control voltage for the voltage controlled oscillator;

a charge source for providing charge for the loop filter during an active state of the charge source, based on a waveform generated by the detector unit;

a charge sink for removing charge from the loop filter during the active state of the charge sink, based on a waveform generated by the detector unit;

a source switch for conducting at least a portion of parasitic charge of the charge source to the ground between two successive active states of the charge source; and a sink switch for conducting at least a portion of parasitic charge of the charge sink to the ground between two successive active states of the charge sink.

2. The radio transceiver of claim 1, wherein the source switch is located between the charge source and a positive electrode of a power supply.

3. The radio transceiver of claim 1, wherein the source switch is switched conductive to the ground at a trailing edge of the active state of the charge source.

4. The radio transceiver of claim 1, wherein the source switch is controlled by the waveform controlling the charge source.

5. The radio transceiver of claim 1, wherein the active state of the charge sink equals the active state of the charge source.

6. The radio transceiver of claim 1, wherein the sink switch is located between the charge sink and a negative electrode of a power supply.

7. The radio transceiver of claim 1, wherein the sink switch is switched conductive to the ground at a trailing edge of the active state of the charge sink.

8. The radio transceiver of claim 1, wherein the sink switch is switched on and off simultaneously with the source switch.

9. The radio transceiver of claim 1, wherein the sink switch is controlled by the waveform controlling the charge sink.

10. The radio transceiver of claim 1, wherein the phase locked loop comprises a sink resistor between the sink switch and the negative electrode of the power supply.

11. A radio transceiver comprising a phase locked loop, the phase locked loop comprising:

a voltage controlled oscillator for generating an output signal with a frequency proportional to a control voltage fed into the voltage controlled oscillator;

a detector unit operationally connected to the voltage controlled oscillator for forming waveforms, based on a reference signal and a feedback signal, the feedback signal being proportional to the output signal of the voltage controlled oscillator;

a loop filter for forming the control voltage for the voltage controlled oscillator;

a charge source for providing charge for the loop filter during an active state of the charge source, based on a waveform generated by the detector unit;

a charge sink for removing charge from the loop filter during the active state of the charge sink, based on a waveform generated by the detector unit;

a source switch for conducting at least a portion of parasitic charge of the charge source to the ground between two successive active states of the charge source; and a sink switch for conducting at least a portion of parasitic charge of the charge sink to the ground between two successive active states of the charge sink.

12. The radio transceiver of claim 11, wherein the source switch is located between the charge source and a positive electrode of a power supply.

13. The radio transceiver of claim 11, wherein the source switch is switched conductive to the ground at a trailing edge of the active state of the charge source.

14. The radio transceiver of claim 11, wherein the source switch is controlled by the waveform controlling the charge source.

15. The radio transceiver of claim 11, wherein the active state of the charge sink equals the active state of the charge source.

16. The radio transceiver of claim 11, wherein the sink switch is located between the charge sink and a negative electrode of a power supply.

17. The radio transceiver of claim 11, wherein the sink switch is switched conductive to the ground at a trailing edge of the active state of the charge sink.

18. The radio transceiver of claim 11, wherein the sink switch is switched on and off simultaneously with the source switch.

19. The radio transceiver of claim 11, wherein the sink switch is controlled by the waveform controlling the charge sink.

20. The radio transceiver of claim 11, wherein the phase locked loop comprises a sink resistor between the sink switch and the negative electrode of the power supply.

21. A phase locked loop comprising:

a voltage controlled oscillator for generating an output signal with a frequency proportional to a control voltage fed into the voltage controlled oscillator;

a detector unit operationally connected to the voltage controlled oscillator for forming waveforms, based on a reference signal and a feedback signal, the feedback signal being proportional to the output signal of the voltage controlled oscillator;

a loop filter for forming the control voltage for the voltage controlled oscillator;

a charge source for providing charge for the loop filter during an active state of the charge source, based on a waveform generated by the detector unit;

a charge sink for removing charge from the loop filter during the active state of the charge sink, based on a waveform generated by the detector unit;

a source switch for conducting at least a portion of parasitic charge of the charge source to the ground between two successive active states of the charge source; and a sink switch for conducting at least a portion of parasitic charge of the charge sink to the ground between two successive active states of the charge sink.

22. The phase locked loop of claim 21, wherein the source switch is located between the charge source and a positive electrode of a power supply.

23. The phase locked loop of claim 21, wherein the source switch is switched conductive to the ground at a trailing edge of the active state of the charge source.

24. The phase locked loop of claim 21, wherein the source switch is controlled by the waveform controlling the charge source.

25. The phase locked loop of claim 21, wherein the active state of the charge sink equals the active state of the charge source.

26. The phase locked loop of claim 21, wherein the sink switch is located between the charge sink and a negative electrode of a power supply.

27. The phase locked loop of claim 21, wherein the sink switch is switched conductive to the ground at a trailing edge of the active state of the charge sink.

28. The phase locked loop of claim 21, wherein the sink switch is switched on and off simultaneously with the source switch.

29. The phase locked loop of claim 21, wherein the sink switch is controlled by the waveform controlling the charge sink.

30. The phase locked loop of claim 21, wherein the phase locked loop comprises a sink resistor between the sink switch and the negative electrode of the power supply.

31. A controller of a phase locked loop, comprising:
a detector unit operationally connected to a voltage controlled oscillator for forming waveforms, based on a reference signal and a feedback signal, the feedback signal being proportional to the output signal of the voltage controlled oscillator;
a loop filter for forming the control voltage for the voltage controlled oscillator;
a charge source for providing charge for the loop filter during an active state of the charge source, based on a waveform generated by the detector unit;
a charge sink for removing charge from the loop filter during the active state of the charge sink, based on a waveform generated by the detector unit;
a source switch for conducting at least a portion of parasitic charge of the charge source to the ground between two successive active states of the charge source; and
a sink switch for conducting at least a portion of parasitic charge of the charge sink to the ground between two successive active states of the charge sink.

32. The controller of claim 31, wherein the source switch is located between the charge source and a positive electrode of a power supply.

33. The controller of claim 31, wherein the source switch is switched conductive to the ground at a trailing edge of the active state of the charge source.

34. The controller of claim 31, wherein the source switch is controlled by the waveform controlling the charge source.

35. The controller of claim 31, wherein the active state of the charge sink equals the active state of the charge source.

36. The controller of claim 31, wherein the sink switch is located between the charge sink and a negative electrode of a power supply.

37. The controller of claim 31, wherein the sink switch is switched conductive to the ground at a trailing edge of the active state of the charge sink.

38. The controller of claim 31, wherein the sink switch is switched on and off simultaneously with the source switch.

39. The controller of claim 31, wherein the sink switch is controlled by the waveform controlling the charge sink.

40. The controller of claim 31, wherein the phase locked loop comprises a sink resistor between the sink switch and the negative electrode of the power supply.

41. A method of controlling a voltage controlled oscillator of a phase locked loop, comprising:
forming waveforms, based on a reference signal and a feedback signal, the feedback signal being proportional to the output signal of the voltage controlled oscillator;
forming the control voltage for the voltage controlled oscillator by a loop filter;
providing charge for the loop filter during an active state of the charge source, based on the waveforms;
removing charge from the loop filter during an active state of a charge sink, based on the waveform;
conducting at least a portion of parasitic charge of the charge source to the ground between two successive active states of the charge source; and
conducting at least a portion of parasitic charge of the charge sink to the ground between two successive active states of the charge sink.

42. The method of claim 41, wherein conducting at least a portion of parasitic charge of the charge source to the ground between two successive active states of the charge source is performed using a source switch located between the charge source and a positive electrode of a power supply.

43. The method of claim 41, wherein conducting at least a portion of parasitic charge of the charge source to the ground between two successive active states of the charge source is performed using a source switch switched conductive to the ground at a trailing edge of the active state of the charge source.

44. The method of claim 41, further comprising controlling the conducting of the at least a portion of parasitic charge of the charge source to the ground using the waveform controlling the charge source.

45. The method of claim 41, wherein the active state of the charge sink equals the active state of the charge source.

46. The method of claim 41, wherein conducting at least a portion of parasitic charge of the charge sink to the ground between two successive active states of the charge sink is performed using a sink switch located between the charge sink and a negative electrode of a power supply.

47. The method of claim 41, wherein conducting at least a portion of parasitic charge of the charge sink to the ground between two successive active states of the charge sink is performed using a sink switch switched conductive to the ground at a trailing edge of the active state of the charge sink.

48. The method of claim 41, wherein conducting at least a portion of parasitic charge of the charge sink to the ground between two successive active states of the charge sink is performed using a sink switch switched on and off simultaneously with a source switch.

49. The method of claim 41, further comprising controlling the conducting of the at least a portion of parasitic charge of the charge sink to the ground between two successive active states of the charge sink using the waveform controlling the charge sink.

50. The method of claim 41, wherein conducting at least a portion of parasitic charge of the charge sink to the ground comprises conducting the parasitic charge of the charge sink to the ground via a sink resistance to the negative electrode of a power supply.

* * * * *